United States Patent [19]

Tanaka et al.

[11] Patent Number: 5,034,340
[45] Date of Patent: Jul. 23, 1991

[54] AMORPHOUS SILICON THIN FILM TRANSISTOR ARRAY SUBSTRATE AND METHOD FOR PRODUCING THE SAME

[75] Inventors: Sakae Tanaka; Yoshiaki Watanabe, both of Tokyo, Japan

[73] Assignee: Seikosha Co., Ltd., Tokyo, Japan

[21] Appl. No.: 371,478

[22] Filed: Jun. 26, 1989

Related U.S. Application Data

[60] Division of Ser. No. 534,003, Jun. 4, 1990, which is a continuation of Ser. No. 306,364, Feb. 3, 1989, abandoned.

[30] Foreign Application Priority Data

Feb. 26, 1988 [JP] Japan ................................. 63-43575

[51] Int. Cl.$^5$ ......................................... H01L 21/283
[52] U.S. Cl. ....................................... 437/41; 437/101; 357/23.7
[58] Field of Search ................... 437/40, 41, 43, 101; 357/4, 23.7

[56] References Cited

U.S. PATENT DOCUMENTS

| | | | |
|---|---|---|---|
| 3,885,196 | 5/1975 | Fischer | 340/781 |
| 4,368,467 | 1/1983 | Unotoro et al. | 340/771 |
| 4,582,395 | 4/1986 | Morozumi | 357/23.7 |
| 4,623,908 | 11/1986 | Oshima et al. | 357/23.7 |
| 4,651,185 | 3/1987 | Holmberg et al. | 357/23.7 |
| 4,704,002 | 11/1987 | Kikuchi et al. | 357/23.7 |
| 4,720,736 | 1/1988 | Takafuji et al. | 357/23.7 |
| 4,723,838 | 2/1988 | Aoki et al. | 357/23.7 |
| 4,778,560 | 10/1988 | Takeda et al. | 357/23.7 |
| 4,779,086 | 10/1988 | Kanno et al. | 340/784 |
| 4,786,780 | 11/1988 | Okabe et al. | 219/121.72 |
| 4,803,536 | 2/1989 | Tuan | 357/23.7 |
| 4,804,953 | 2/1989 | Castleberry | 357/23.7 |
| 4,810,061 | 3/1989 | Nakanowatari et al. | 350/334 |
| 4,823,180 | 4/1989 | Wieder et al. | 357/23.7 |
| 4,853,755 | 8/1989 | Okabe et al. | 357/23.7 |
| 4,890,097 | 12/1989 | Yamashita et al. | 340/784 |

FOREIGN PATENT DOCUMENTS

| | | | |
|---|---|---|---|
| 0092663 | 5/1985 | Japan | 357/23.7 |
| 0105275 | 6/1985 | Japan | 357/23.7 |
| 0051878 | 3/1986 | Japan | 357/23.7 |
| 0122171 | 6/1987 | Japan | 357/23.7 |
| 0001072 | 1/1988 | Japan | 357/23.7 |
| 0047979 | 2/1988 | Japan | 357/23.7 |

Primary Examiner—Olik Chaudhuri
Assistant Examiner—M. Wilczewski
Attorney, Agent, or Firm—Jordan and Hamburg

[57] ABSTRACT

An amorphous silicon thin film transistor array substrate is formed on an insulating substrate with a gate insulating layer, a gate wiring interconnecting gate electrodes and source wiring interconnecting source electrodes. The gate insulating layer is provided in a lower layer of a terminal part of the source wiring. In the process for forming the array, the gate insulating layer is formed in a portion of the structure other than the terminal part of the gate, and the terminal part of the source wiring is formed on the gate insulating layer.

2 Claims, 7 Drawing Sheets

14a metal mask
1 insulating substrate

AMORPHOUS SILICON THIN FILM TRANSISTOR ARRAY SUBSTRATE AND METHOD FOR PRODUCING THE SAME

This is a division of application Ser. No. 306,364, filed Feb. 3, 1989, now abandoned, and refiled as a file wrapper continuation application Ser. No. 534,003, filed June 4, 1990.

BACKGROUND OF THE INVENTION

The present invention relates to an amorphous silicon thin film transistor array utilized in an active matrix type liquid crystal display device or the like, and a method for producing the same.

In recent years, a liquid crystal matrix display device, especially a liquid crystal display device of the so-called active matrix type provided with a switching element per each pixel has been under research and development in various places for a thin type picture image display device. An MIS type thin film transistor (hereinafter referred to as TFT) using amorphous silicon (hereinafter referred to as a-Si) has been primarily utilized for the above switching element.

FIG. 8 shows an example of the construction of an active matrix type liquid crystal display device using TFT. In this Figure, when Xi is selected, for example, in the gate wiring 8, the gates of respective TFT 21-a connected thereto are turned on all at once, and through the sources of these TFTs turned on, the signal voltage corresponding to the picture information is transmitted from respective signal lines 12 to the drains of the respective TFT 21-a. A pixel electrode (not shown in the Figure) is connected to the drain, and due to the voltage difference between this pixel electrode and the counter electrode 23 formed on the substrate, which is on the other side, putting the liquid crystal layer 22 therebetween, the optical transparency of the liquid crystal layer 22 is changed to effect picture image display.

When Xi is in a non-selective state, the gate of each TFT 21-a connected thereto is off, and successively, Xi+1 is selected, and the gate of each TFT 21-b connected thereto is turned on, and a process similar to that as described above is effected. Since the voltage difference between both the pixel electrode and the counter electrode 23 is preserved by the liquid crystal layer 22 until the same gate wiring 8 is selected in the next time, the liquid crystal corresponding to each pixel is statically driven, and a display of high contrast can be obtained even after the gate has been turned off.

FIG. 9 is a diagram showing an example of the a-Si TFT used in the above-described TFT 21-a and 21-b. Numeral 1 denotes an insulating substrate such as glass or the like, numeral 2 a gate insulating layer, numeral 3 an amorphous silicon layer, numeral 4 a protective insulating layer, numeral 9 a gate electrode, numeral 12 a source wiring, numeral 13 a pixel electrode, numeral 15 a source electrode, and numeral 16 a drain electrode. As shown in this Figure, a gate electrode 9, a source electrode 15 and a drain electrode 16 are formed putting the gate insulating layer 2 and the amorphous silicon layer 3 therebetween, and the gate electrode 9 is formed on the side nearer to the substrate than the source electrode 15 and drain electrode 16. A TFT having the structure explained above is called a reverse staggered type TFT.

In an active matrix type liquid crystal display device, since the terminal part of the gate wiring should effect the connection to the external circuit at the peripheral part of the substrate, the gate insulating layer 2 or the like must not be formed on the gate wiring terminal part in the peripheral part of the substrate. In usual cases, as shown in FIG. 10, when a gate insulating layer or the like is formed, a metal.. mask 14 is used to mask the peripheral part of the insulating substrate 1 such that a gate insulating layer or the like is not formed at this masked part.

SUMMARY OF THE INVENTION

FIG. 11 is a sectional diagram showing the terminal part of the source wiring when the gate insulating layer and the like were formed by the method as shown in FIG. 10. In this Figure, numeral 1 denotes an insulating substrate, numeral 2 a gate insulating layer, numeral 8a a source wiring terminal part, and numeral 8 a source wiring. When a gate insulating layer or the like is formed by using a metal mask as shown in FIG. 10, the gate insulating layer 2 is not formed also in the part of the source wiring terminal part 8a as shown in FIG. 11. Therefore, the source wiring 8 is formed across the interface of the gate insulating layer 2 and the insulating substrate 1, and due to the effect of such difference of the underlying layers or the level difference in the interface part, stress is generated in the neighborhood of the interface of the source wiring 8, and in this case film peeling or wire breaking results, which are serious problems for the yield of the products.

The present invention is therefore directed to a thin film transistor array and method for producing the same, reducing the above-described film peeling or the wire breaking in the neighborhood of the terminal part of the source wiring and improving the production yield.

DESCRIPTION OF THE PREFERRED EMBODIMENTS

In the following, an embodiment of the present invention will be explained by referring to FIGS. 1 to 4. FIGS. 1 to 3 show the source wiring terminal part, gate wiring terminal part, and TFT part formed by the same process respectively, and an explanation will be given of this production process.

Figure 1A:
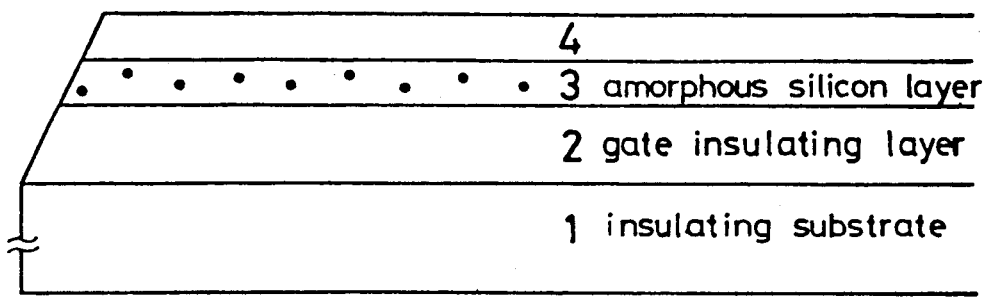
FIGS. 1(a)–1(d), 2(a)–2(d) and 3(a)–3(d) are sectional diagrams of a process showing the views of the source wiring terminal part, gate wiring terminal part, and transistor part, respectively.
Figure 1D:
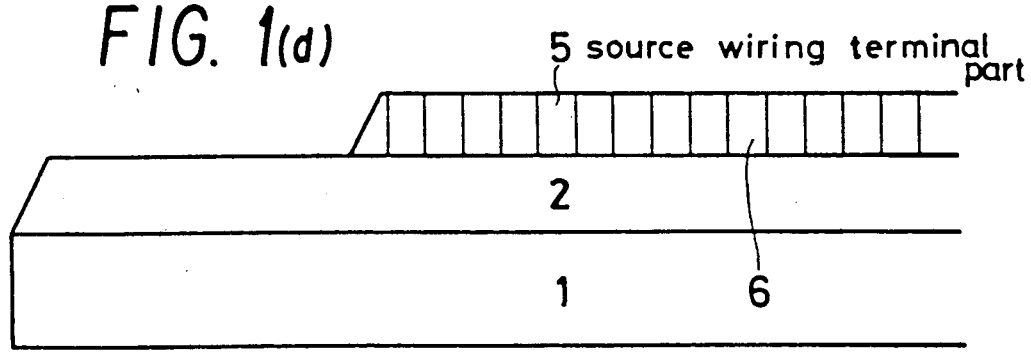
Figure 2A:
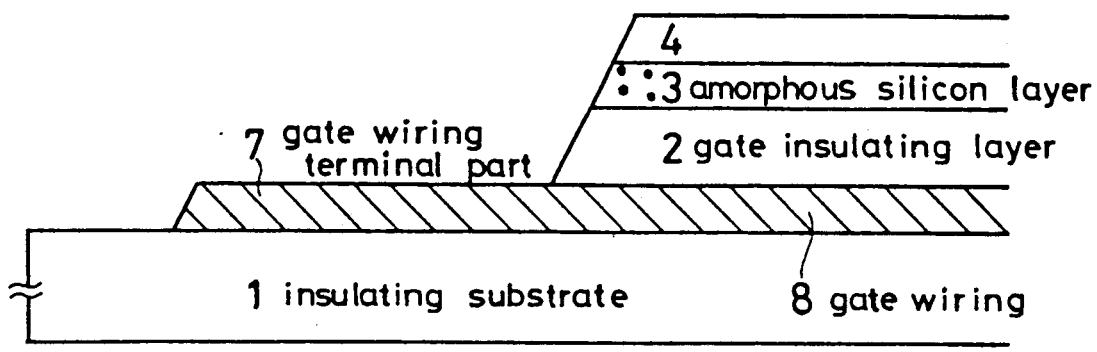
Figure 3A:
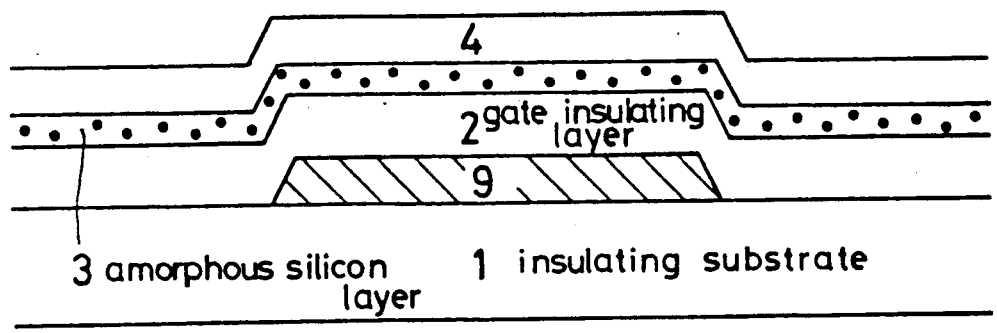
Figure 3B:
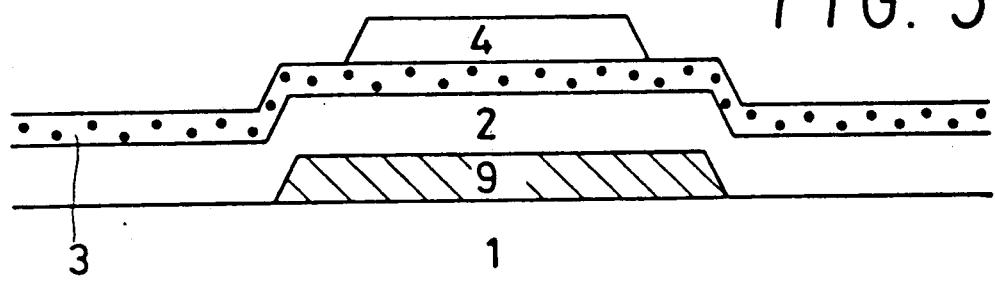
Figure 3C:
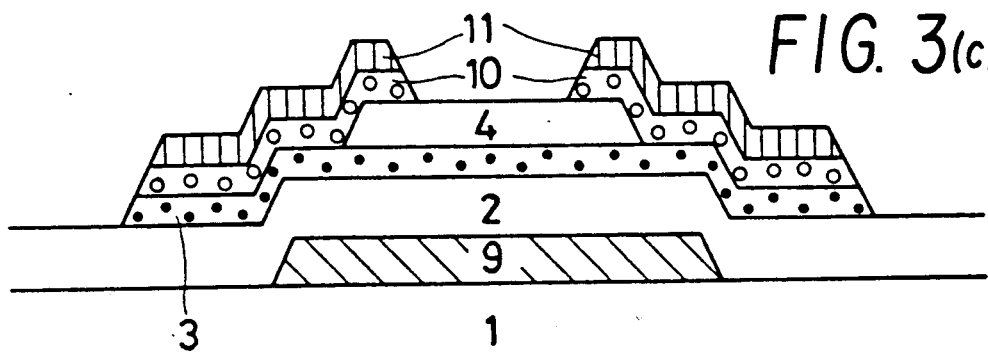

FIGS. 1(a), 2(a) and 3 illustrate a gate insulating layer 2 made of silicon nitride, an amorphous silicon layer 3, and a protective insulating layer 4 made of silicon nitride deposited by the plasma CVD method on an insulating substrate 1 made of glass or the like on which a gate electrode 9 (FIG. 3(a)) and a gate wiring 8 (FIG. 2(a)) have been formed. The above-described respective layers are deposited by only masking the gate wiring terminal part by using the metal mask 14a as shown in FIG. 4. Therefore, the above-described respective layers are not deposited on the gate wiring terminal part 7 as shown in FIG. 2(a), but the above-described respective layers are deposited on the source wiring terminal part as shown in FIG. 1(d).

Figure 1B:
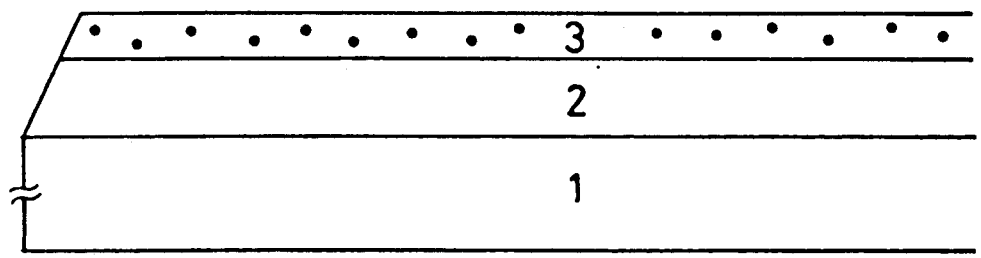
Figure 2B:
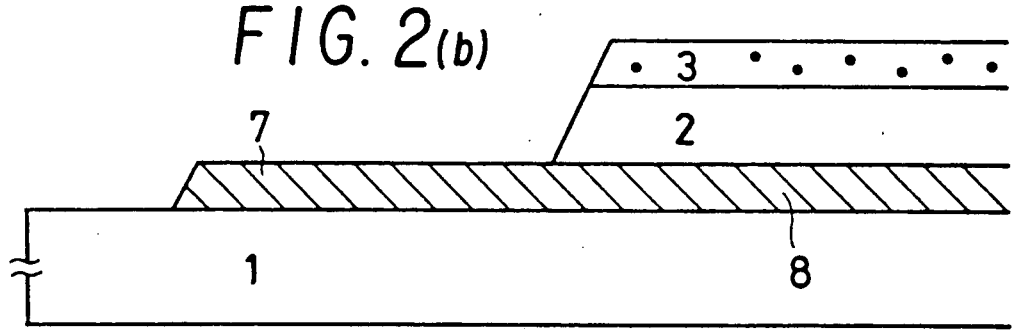

In FIGS. 1(b), 2(b) and 3, the protective insulating layer 4 is etched with a buffer fluoric acid solution leaving the TFT part except the other part.

Figure 1C:
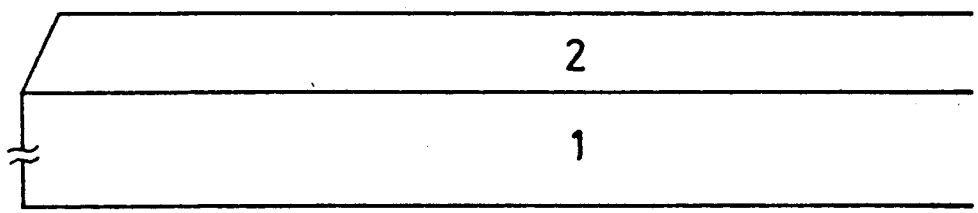
Figure 2C:
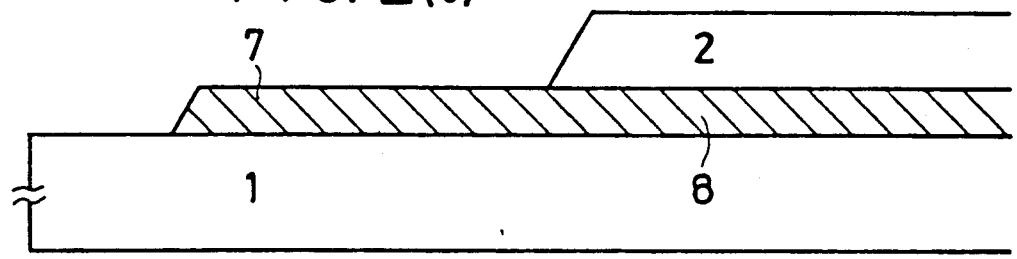

In FIGS. 1(c), 2(c) and 3, with the object of forming ohmic contact with the amorphous silicon layer 3, a silicon layer 10 (FIG. 3(c)) containing n-type impurities (hereinafter referred to as n-type silicon layer) is deposited by the plasma CVD method, and then, a metal layer 11 (FIG. 3(c)) is deposited by the vacuum vapor deposition method. The metal layer 11 is patterned into the shapes of a source electrode and a drain electrode, and by making this patterned metal layer 11 and the protective insulating layer 4 as the mask, the amorphous silicon layer 3 and n-type silicon layer 10 are etched by using an organic alkaline solution.

Figure 2D:
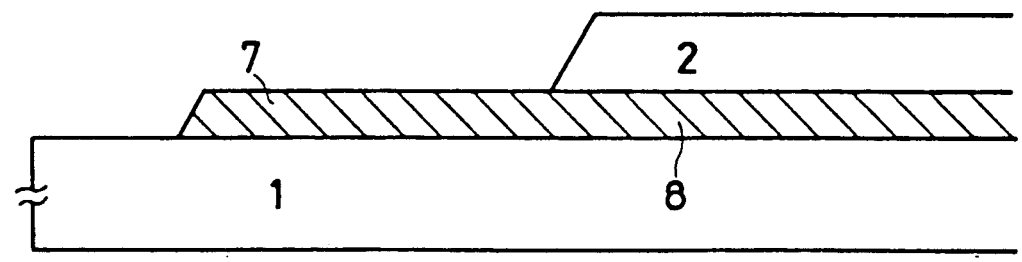
Figure 3D:
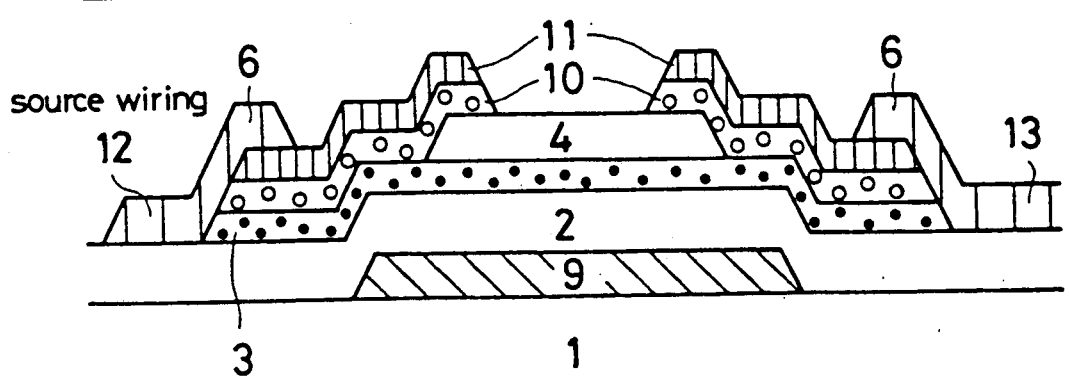
Figure 4:
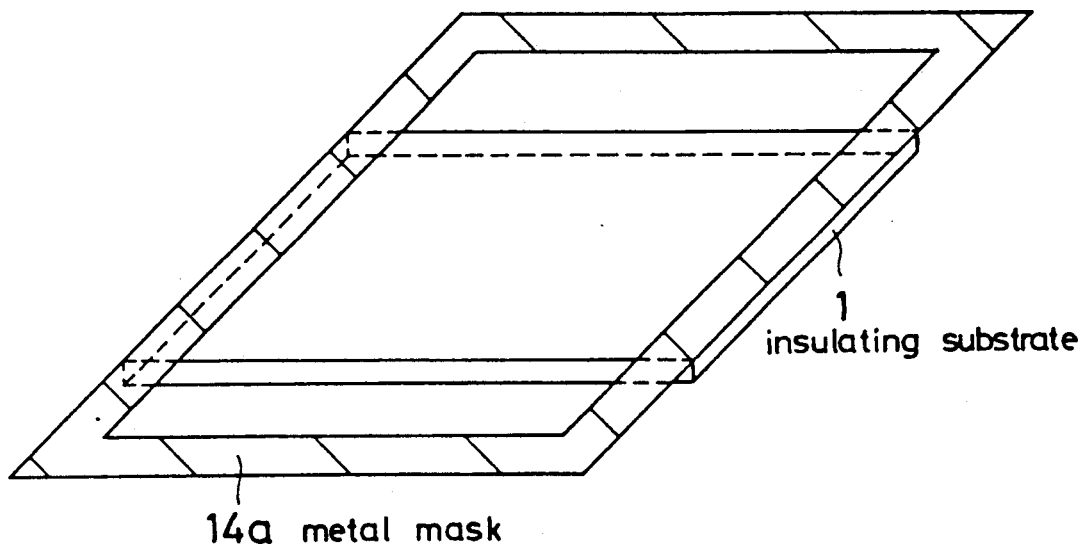
FIG. 4 is a perspective diagram showing the relationship between the metal mask and the insulating substrate used in the execution of the present invention.
Figure 10:
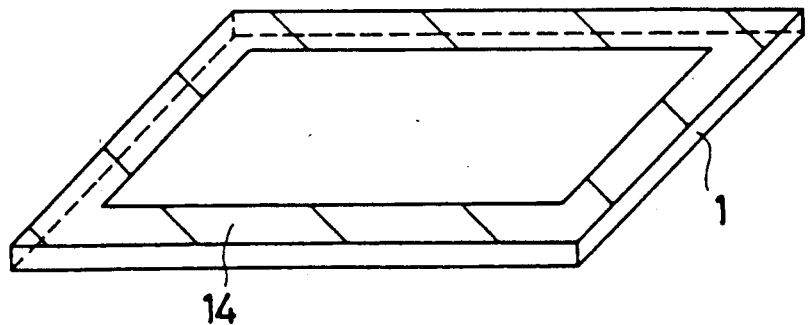
FIG. 10 is a perspective diagram showing the relationship between the metal mask and the insulating substrate used in the conventional production method.

In FIGS. 1(d), 2(d) and 3, a transparent electric conductive layer 6 (FIG. 3(d)) is deposited by the vacuum vapor deposition method, and this is selectively etched by using a ferric chloride solution to form the source wiring 12 (FIG. 3(d)) and the pixel electrode 13 (FIG. 3(d)). At this time, the source wiring terminal part 5 is formed on the gate insulating layer 2 as shown in FIG. 1(d).

In the a-Si TFT array substrate formed in such a manner as described above, since the gate insulating layer 2 and the like are formed by using a metal mask 14a as shown in FIG. 4, the gate wiring terminal part 7 has an exposed surface as shown in FIG. 2(d), and the source wiring terminal part 5 is formed flat on the gate insulating layer 2 as shown in FIG. 1(d).

Figure 5:
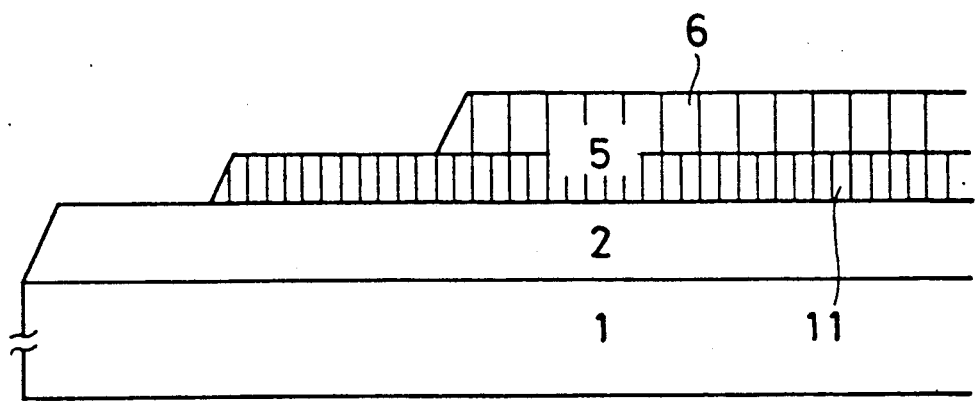
FIGS. 5 to 7 are sectional diagrams of the source wiring terminal part used in another Example of the present invention.
Figure 6:
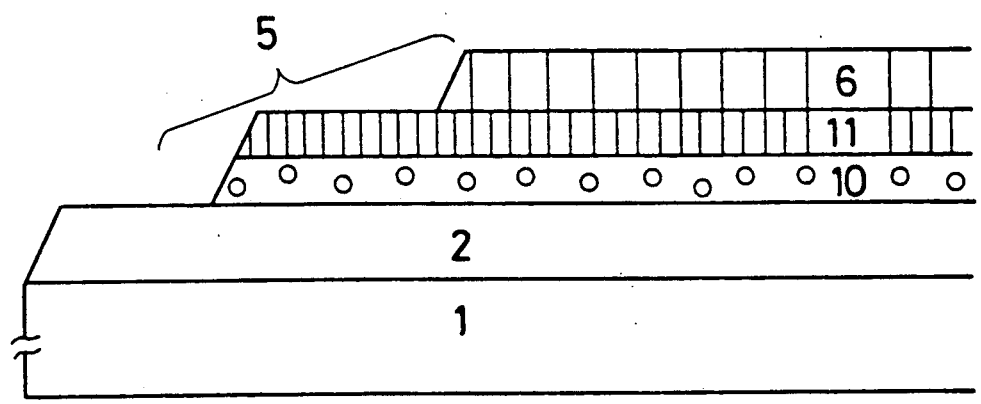
Figure 7:
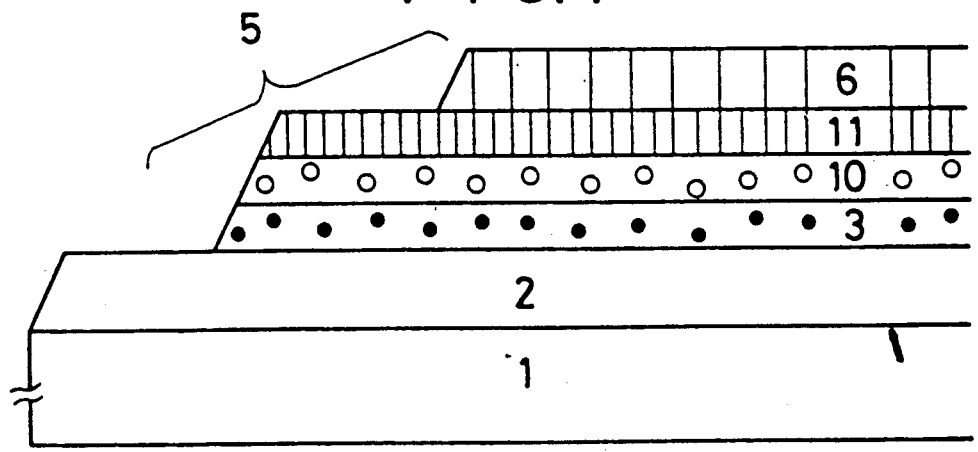
Figure 8:
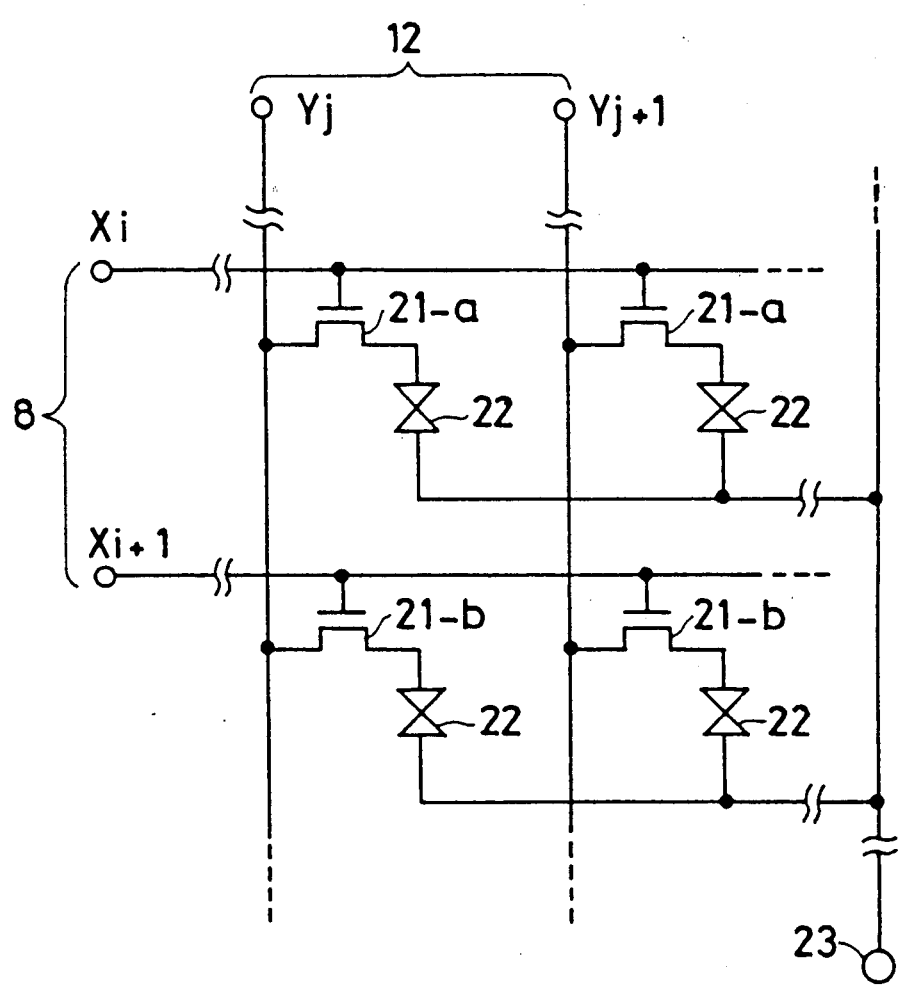
FIG. 8 is a circuit diagram showing the construction of the active matrix type liquid crystal display device.
Figure 9:
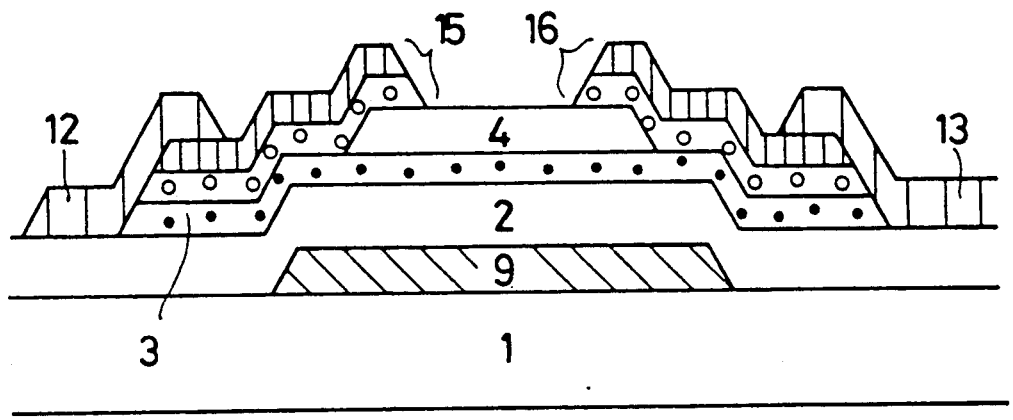
FIG. 9 is a sectional diagram showing an example of the reverse staggered type amorphous silicon thin film transistor.
Figure 11:
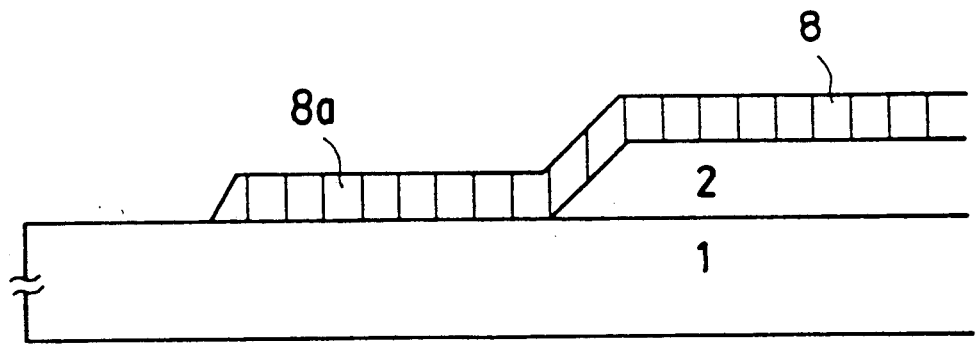
FIG. 11 is a sectional diagram of a conventional source wiring terminal part.

FIGS. 5 to 7 are sectional diagrams showing the construction of a source terminal part in the other Example of the present invention. In these Figures, numeral 1 denotes an insulating substrate, numeral 2 a gate insulating layer, numeral 3 an a-Si layer, numeral 5 a source wiring terminal part, numeral 6 a transparent conductive layer, numeral 10 an n-type silicon layer, and numeral 11 a metal layer. The Example in FIG. 5 shows the source wiring terminal part 5 formed of a transparent conductive layer 6 and a metal layer 11.

The Example in FIG. 6 shows the source wiring terminal part 5 formed of a transparent conductive layer 6, a metal layer 11 and an n-type silicon layer 10.

The Example in FIG. 7 shows the source wiring terminal part formed of a transparent conductive layer 6, a metal layer 11, an n-type silicon layer 10, and an a-Si layer 3.

In each of the above-described Examples, since the metal mask 14a as shown in FIG. 4 is used in forming the gate insulating layer 2, the source wiring terminal part 5 is formed flat on the gate insulating layer 2.

As can be clearly apparent from the above explanation, in the present invention, since the gate wiring terminal part is masked and the source wiring part is not masked in forming the gate insulating layer, it is possible to form the source wiring part flat on the gate insulating layer with the gate wiring part left exposed in the same manner as in the conventional case. Also, the above-described production can be achieved by only changing the shape of the metal mask.

According to the present invention, since the source wiring terminal part is formed on the gate insulating layer, film peeling, wire breaking and the like near the source wiring part are reduced to a large extent, and an improvement of production yield to a large extent ca be expected.

Moreover, in forming the gate insulating layer, since the gate wiring terminal part only is masked and the source wiring part is not masked, the number of the production processes is not changed in any way from the conventional one, so that there is no increase in the number of processes.

We claim:

1. A method for producing an amorphous silicon thin film transistor array substrate having a plurality of amorphous silicon thin film transistors formed on an insulating substrate, each of said amorphous silicon thin film transistors having a gate electrode formed on said insulating substrate, a gate insulating layer covering said gate electrode, an amorphous silicon layer formed on said gate insulating layer, and source and drain electrodes formed on said amorphous silicon layer, said method comprising:

forming gate electrodes on an insulating substrate and simultaneously forming gate wiring on said insulating substrate for connecting said gate electrodes to one another, said gate wiring having a gate terminal adjacent an edge of said insulating substrate for connection to an external circuit, forming a gate insulating layer on substantially the entire surface of said insulating substrate to cover said gate electrodes and said gate wiring but not said gate terminal, forming an amorphous silicon layer on said gate insulating layer, for forming said amorphous silicon thin film transistors, forming source and drain electrodes on said amorphous silicon layer, and forming source wiring for connecting said source electrodes to one another, said source wiring having a source terminal adjacent an edge of said insulating substrate for connection to an external circuit, said source terminal being formed entirely on said gate insulating layer, whereby said source terminal is at substantially the same level as the portion of the source wiring adjacent thereto.

2. In a method for producing an amorphous silicon thin film transistor array substrate having a plurality of amorphous silicon thin film transistors formed on an insulating substrate, each of said amorphous silicon thin film transistors having a gate electrode formed on said insulating substrate, a gate insulating layer covering said gate electrode, an amorphous silicon layer formed on said gate insulating layer, and source and drain electrodes formed on said amorphous silicon layer, wherein said method comprises:

forming gate electrodes on an insulating substrate and simultaneously forming gate wiring on said insulating substrate for connecting said gate electrodes to one another, said gate wiring having a gate terminal adjacent an edge of said insulating substrate for connection to an external circuit, forming a gate insulating layer on substantially the entire surface of said insulating substrate, forming an amorphous silicon layer on said gate insulating layer, for forming said amorphous silicon thin film transistors, forming source and drain electrodes on said amorphous silicon layer, and forming source wiring for connecting said source electrodes to one another, said source wiring having a source terminal adjacent an edge of said insulating substrate for connection to an external circuit, the improvement wherein said step of forming a gate insulating layer comprises forming said gate insulating layer except on said gate terminal, and said step of forming said source wiring comprises forming said source terminal entirely on said gate insulating layer, whereby said source terminal is at substantially the same level as the portion of the source wiring adjacent thereto.

* * * * *